United States Patent
Kamei et al.

(10) Patent No.: US 7,709,911 B2
(45) Date of Patent: May 4, 2010

(54) SEMICONDUCTOR DEVICE HAVING SILICIDE TRANSISTORS AND NON-SILICIDE TRANSISTORS FORMED ON THE SAME SUBSTRATE AND METHOD FOR FABRICATING THE SAME

(75) Inventors: Masayuki Kamei, Toyama (JP); Isao Miyanaga, Toyama (JP); Takayuki Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 529 days.

(21) Appl. No.: 11/522,996

(22) Filed: Sep. 19, 2006

(65) Prior Publication Data

US 2007/0131984 A1 Jun. 14, 2007

(30) Foreign Application Priority Data

Dec. 12, 2005 (JP) .............................. 2005-358103

(51) Int. Cl.
H01L 29/78 (2006.01)
(52) U.S. Cl. ..................... 257/413; 257/368; 257/384; 257/E29.156; 257/E29.161
(58) Field of Classification Search ............... 438/275; 257/E21.622, 288, E21.301, E21.619, E21.62, 257/368, 369, 384, 388, 412, 413, E29.156, 257/E29.161, E21.203, E21.44, E21.593, 257/E21.636

See application file for complete search history.

(56) References Cited

U.S. PATENT DOCUMENTS 4,847,111 A * 7/1989 Chow et al. ................. 438/586
5,075,251 A * 12/1991 Torres et al. ................ 438/664
6,020,240 A * 2/2000 Wu ........................... 438/275
6,114,241 A * 9/2000 Choi et al. .................. 438/677
6,162,675 A * 12/2000 Hwang et al. ............... 438/241
6,667,197 B1 * 12/2003 Gluschenkov et al. ...... 438/165
6,987,061 B2 * 1/2006 Mehrotra .................... 438/682
2002/0168847 A1 * 11/2002 Narwankar et al. ......... 438/635
2004/0224450 A1 * 11/2004 Itonaga et al. .............. 438/197
2006/0073665 A1 * 4/2006 Jain .......................... 438/303
2007/0063294 A1 * 3/2007 Bu et al. .................... 257/408

FOREIGN PATENT DOCUMENTS

JP 2001-144287 A 5/2001

OTHER PUBLICATIONS

S Taylor, J F Zhang, and W Eccleston, "A review of the plasma oxidation of silicon and its applications", Semicond. Sci. Technol. 8 (1993) 1426-1433.*

* cited by examiner

Primary Examiner—Matthew C Landau
Assistant Examiner—Daren Wolverton
(74) Attorney, Agent, or Firm—McDermott Will & Emery LLP (57) ABSTRACT

A semiconductor device includes a first MIS transistor of a non-salicide structure and a second MIS transistor of a salicide structure which are both formed on a substrate of silicon. The first MIS transistor includes a first gate electrode of silicon, first sidewalls, a first source and drain, and plasma reaction films grown in a plasma atmosphere to cover the top surfaces of the first gate electrode and first source and drain, wherein the plasma reaction film prevents silicide formation on the first MIS transistor.

12 Claims, 4 Drawing Sheets

SEMICONDUCTOR DEVICE HAVING SILICIDE TRANSISTORS AND NON-SILICIDE TRANSISTORS FORMED ON THE SAME SUBSTRATE AND METHOD FOR FABRICATING THE SAME

CROSS-REFERENCE TO RELATED APPLICATIONS

The disclosure of Japanese Patent Application No. 2005-358103 filed on Dec. 12, 2005 including specification, drawings and claims is incorporated herein by reference in its entirety.

BACKGROUND OF THE INVENTION (1) Field of the Invention

The present invention relates to semiconductor devices and methods for fabricating the same, and more particularly relates to semiconductor devices in which transistors of a salicide structure (hereinafter, referred to as "salicide transistors") and transistors of a non-salicide structure (hereinafter, referred to as "non-salicide transistors") are formed on the same substrate and methods for fabricating the same.

(2) Description of Related Art

In recent years, with increases in the degree of integration and operating speed of semiconductor integrated circuits, gate electrodes and interconnects of metal insulator semiconductor field effect transistors (MISFETs) are becoming finer.

Accordingly, there has been a demand for salicide transistors each having a low-resistance electrode. A salicide transistor is formed in the following manner: Refractory metal films are formed on source/drain diffusion regions formed in a silicon substrate and a gate electrode of polysilicon, and then the refractory metal films are subjected to heat treatment so that silicide layers of a refractory metal are formed on the respective top surfaces of the source/drain diffusion regions and gate electrode in a self-aligned manner.

However, a salicide transistor has a low resistance to application of a high voltage and a high current both caused by static electricity (surges) or the like from outside to the salicide transistor and is therefore likely to be broken. Hence, in general, in order to enhance the resistance to a high voltage and a high current both caused by surges or the like, non-salicide transistors are often used for input/output circuits of semiconductor devices.

Resistors having a desired resistance are demanded for analog circuits or other circuits. Therefore, instead of source/drain diffusion layers and a gate electrode of a salicide structure having a low resistance, source/drain diffusion layers and a gate electrode of a non-salicide structure having a fixed resistance may be required.

A semiconductor device in which salicide transistors and non-salicide transistors are both formed on the same substrate is formed in the following manner. First, a plurality of transistors are formed on a substrate, and then a protective film of silicon oxide or any other material is formed to cover the transistors. Next, parts of the protective film covering some of the transistors that will become salicide transistors are removed, and then the entire substrate area is salicided (see, for example, Japanese Unexamined Patent Publication No. 2001-144287).

For a known semiconductor device, for example, a thick silicon oxide film needs to be used as a protective film. The protective film must be formed after formation of source/drain diffusion layers. In view of the above, in order to maintain the diffusion profile of the source/drain diffusion layers, the protective film must be formed at a low temperature. Therefore, an oxide film deposited at a temperature of 750° C. or less by chemical vapor deposition (CVD) is used as the protective film.

An oxide film deposited by low-temperature CVD has a lower density than a thermal oxide film formed by high-temperature heat treatment and when etched using hydrofluoric acid and a mixed solution of ammonia and a hydrogen peroxide solution (ammonium hydroxide hydrogen peroxide mixture (APM)), has a very high etch rate. In view of the above, when the protective film is thin, it becomes lost in wet cleaning carried out in a semiconductor device fabrication process. As a result, non-salicide transistors cannot be protected. As seen from the above, the protective film needs to have a thickness of 30 nm or more.

Figure 4:
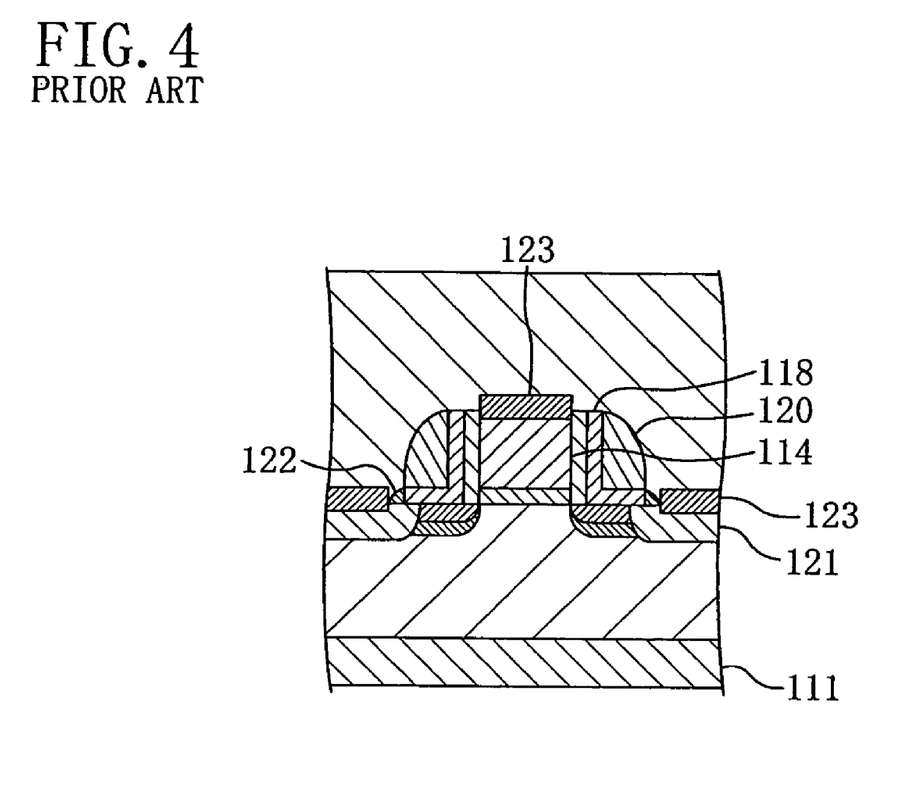
FIG. 4 is a cross-sectional view illustrating a known salicide transistor.

An increase in the thickness of a protective film causes the following problems. FIG. 4 illustrates a cross section of a known salicide transistor. A protective film 118 is formed on the entire surface of a substrate 111, and then a portion 122 of the protective film 118 located on a region of the substrate 111 on which the salicide transistor is to be formed is removed by dry etching. However, since the protective film for a known semiconductor device is thick, the portion 122 of the protective film 118 is left at the foot of each of sidewalls 120 as illustrated in FIG. 4. When the entire substrate area is further etched to prevent the protective film from being partially left at the foot of each sidewall, the top surfaces of a source/drain 121 and gate electrode 114 are cut away by overetching, resulting in deteriorated transistor characteristics.

When the entire substrate area is salicided with the protective film partially left at the foot of each sidewall, this makes an area in which ones of silicide layers 123 located on the source and drain are formed smaller. Miniaturization of semiconductor devices allows the distance between adjacent ones of gate electrodes to be approximately 140 nm. This increases the influence of the unintentionally left part of the protective film having a thickness of several tens of nm, leading to the increased contact resistance of a contact plug connected to the silicide layer 123.

SUMMARY OF THE INVENTION

The present invention is made to solve the known problems, and its object is to provide a semiconductor device in which a salicide transistor and a non-salicide transistor are formed on a single substrate and which prevents the contact resistance of the salicide transistor from increasing due to part of a protective film for salicidation and a fabrication method for the same.

In order to solve the known problems, a semiconductor device of the present invention is configured such that a non-salicide transistor includes a protective film made of a plasma reaction film.

To be specific, a semiconductor device of the present invention includes: a substrate of silicon; a first MIS transistor including a first gate electrode of silicon formed on the substrate, first sidewalls formed on both sides of the first gate electrode, first source/drain regions formed in regions of the substrate located further from the first gate electrode than the first sidewalls, and plasma reaction films covering the respective top surfaces of the first gate electrode and first source/drain regions; and a second MIS transistor including a second gate electrode of silicon formed on the substrate, second sidewalls formed on both sides of the second gate electrode, second source/drain regions formed in regions of the substrate located further from the second gate electrode than the second sidewalls, and silicide layers covering the respective top surfaces of the second gate electrode and second source/drain regions.

According to the semiconductor device of the present invention, even with a reduction in the thickness of a protective film, a non-salicide transistor can be formed. Reduction in the thickness of the protective film prevents the protective film from being left at the foot of sidewalls of a salicide transistor. Thus, the area in which silicide layers are formed is not reduced. This can restrain the resistance of silicided source/drain regions of the salicide transistor and the contact resistance thereof from increasing.

In the semiconductor device of the present invention, the plasma reaction films preferably cover parts of the first MIS transistor except for at least the first sidewalls.

In the semiconductor device of the present invention, each said first sidewall preferably includes an offset spacer having an I-shaped cross section and made of a thermal oxide film.

In this case, it is preferable that the plasma reaction films are formed of a plasma oxide film and the plasma oxide film is made of silicon oxide having a density equal to or higher than the thermal oxide film. With the above-mentioned structure, even when the plasma reaction films are thin, the first MIS transistor can be prevented from being silicided with reliability.

It is preferable that the plasma reaction films are formed of a plasma oxide film and the wet etch rate of the plasma oxide film is equal to or lower than that of the thermal oxide film.

In the semiconductor device of the present invention, the plasma reaction films are preferably formed of a plasma oxide film.

In the semiconductor device of the present invention, each said first sidewall preferably includes an L-shaped sidewall having an L-shaped cross section and formed of a CVD oxide film.

In this case, it is preferable that the plasma reaction films are formed of a plasma oxide film and the plasma oxide film is made of silicon oxide having a higher density than the CVD oxide film.

It is preferable that the plasma reaction films are formed of a plasma oxide film and the wet etch rate of the plasma oxide film is lower than that of the CVD oxide film.

In the semiconductor device of the present invention, the plasma reaction films are preferably formed of a plasma nitride film. Also when the plasma reaction films are nitride films, the same effect as when they are oxide films can be provided.

Each said plasma reaction film preferably has a thickness of 1 nm through 6 nm both inclusive. This structure prevents the non-salicide transistor from being salicided with reliability and prevents the protective film from being left at the foot of the sidewalls of the salicide transistor with reliability.

In the semiconductor device of the present invention, the plasma reaction films are preferably formed using inductively-coupled plasma.

A method for fabricating a semiconductor device of the present invention includes the steps of: (a) forming a first gate electrode and a second gate electrode made of a silicon film on a substrate of silicon; (b) forming first sidewalls on both sides of the first gate electrode and forming second sidewalls on both sides of the second gate electrode; (c) forming first source/drain regions in regions of the substrate located further from the first gate electrode than the first sidewalls and forming second source/drain regions in regions of the substrate located further from the second gate electrode than the second sidewalls; (d) forming plasma reaction films to cover the respective top surfaces of the first gate electrode and first gate/drain regions; and (e) after the step (d), forming silicide layers on the respective top surfaces of the second gate electrode and second source/drain regions.

According to the method of the present invention, thin plasma reaction films can be formed which are prevented from being eliminated in a cleaning process step and any other process step during a semiconductor device fabrication process and left after their removal using dry etching. Since such plasma reaction films cover the top surfaces of the first gate electrode and first source/drain regions, this can certainly prevent the first MIS transistor from being silicided and can certainly silicide the top surfaces of the second gate electrode and second source/drain regions because of the absence of plasma reaction films in the second MIS transistor. As a result, a fabrication method for a semiconductor device can be achieved which allows both a non-salicide transistor and a salicide transistor to be fabricated on a single substrate and prevents the resistance of silicided source/drain regions of the salicide transistor and the contact resistance thereof from increasing.

In the method of the present invention, the step (d) preferably includes the steps of exposing the substrate to plasma, thereby forming the plasma reaction films on the top surfaces of the first gate electrode and first source/drain regions and the top surfaces of the second gate electrode and second source/drain regions, and selectively removing ones of the plasma reaction films formed on the second gate electrode and the second source/drain regions and allowing the other ones of the plasma reaction films to be left on the top surfaces of the first gate electrode and first source/drain regions. With this structure, plasma reaction films can be certainly formed to cover only the top surfaces of the first gate electrode and first source/drain regions.

In the method of the present invention, the step (d) preferably includes the steps of forming a resist on the substrate to cover the second gate electrode and the second source/drain regions and expose the first gate electrode and the first source/drain regions, and exposing the substrate on which the resist is formed to plasma, thereby forming the plasma reaction films on the top surfaces of the first gate electrode and first source/drain regions. This structure eliminates the need for etching for removing ones of the plasma reaction films located on a region of the substrate in which the second MIS transistor is to be formed. This prevents the plasma reaction films from being left at the foot of the sidewalls of the second MIS transistor and prevents silicidation of impurity diffusion layers of the second MIS transistor from being hindered. Furthermore, since the plasma reaction films can be formed at a room temperature, a usual photoresist can be used as a mask. This prevents fabrication process steps for a semiconductor device from being complicated.

In the method of the present invention, in the step (d), the plasma reaction films are preferably formed of a plasma oxide film using oxygen plasma.

In the method of the present invention, in the step (d), the plasma reaction films are preferably formed of a plasma nitride film using nitrogen plasma.

In the method of the present invention, in the step (d), the plasma reaction films are preferably formed using inductively-coupled plasma.

DETAILED DESCRIPTION OF THE INVENTION

Embodiment 1

Figure 1:
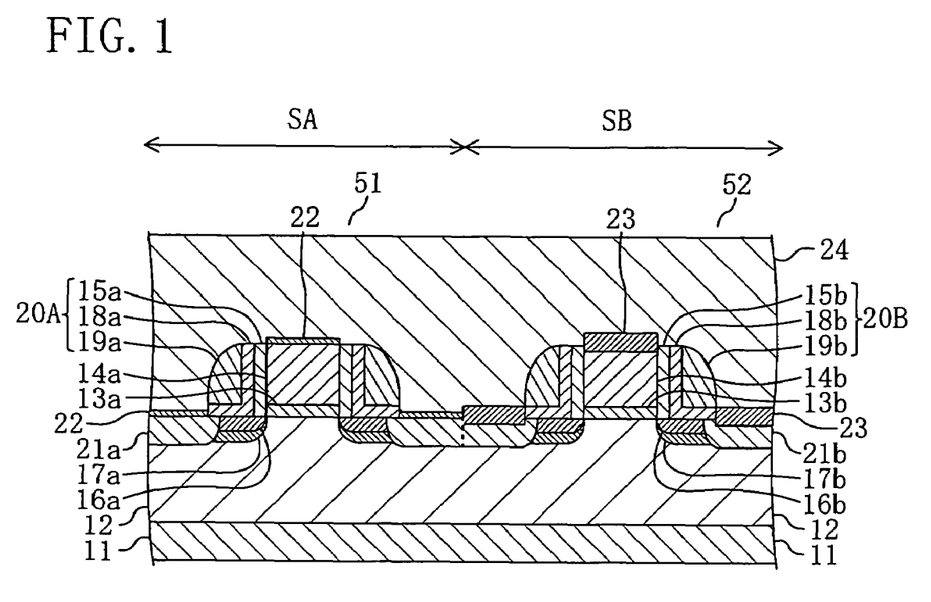
FIG. 1 is a cross-sectional view illustrating a semiconductor device according to a first embodiment of the present invention.

A first embodiment of the present invention will be described with reference to the drawings. FIG. 1 illustrates a cross-sectional structure of a semiconductor device according to the first embodiment of the present invention. A region SA of a substrate on which a non-salicide transistor is to be formed (hereinafter, referred to as "non-salicide transistor formation region SA") is shown on the left side of FIG. 1, and a region SB of the substrate on which a salicide transistor is to be formed (hereinafter, referred to as "salicide transistor formation region SB") is shown on the right side of FIG. 1.

As illustrated in FIG. 1, the semiconductor device of this embodiment includes a p-type well 12 formed in a semiconductor substrate 11 of silicon, a first MIS transistor 51 of a non-salicide structure formed on a non-salicide transistor formation region SA of the semiconductor substrate 11 (well 12), and a second MIS transistor 52 of a salicide structure formed on a salicide transistor formation region SB of the semiconductor substrate 11 (well 12). The first and second MIS transistors 51 and 52 are covered with an interlayer dielectric 24.

The first MIS transistor 51 includes a gate insulating film 13a formed on the semiconductor substrate 11 (well 12), a gate electrode 14a of polysilicon formed on the gate insulating film 13a, sidewalls 20A formed on both sides of the gate electrode 14a, n-type extension regions 16a formed in regions of the semiconductor substrate 11 located to both sides of the gate electrode 14a, p-type pocket regions 17a formed in regions of the semiconductor substrate 11 located under the n-type extension regions 16a, n-type source/drain regions 21a formed in regions of the semiconductor substrate 11 located further from the gate electrode 14a than the sidewalls 20A, and plasma reaction films 22 formed on the top surfaces of the gate electrode 14a and source/drain regions 21a, respectively, by oxidizing silicon in an oxygen plasma atmosphere. The sidewalls 20A include offset spacers 15a formed on both sides of the gate electrode 14a, first sidewalls (L-shaped sidewalls) 18a formed on the lateral sides of the offset spacers 15a to take the form of L, and plate-like second sidewalls 19a formed on the first sidewalls 18a.

The second MIS transistor 52 includes a gate insulating film 13b formed on the semiconductor substrate 11 (well 12), a gate electrode 14b of polysilicon formed on the gate insulating film 13b, sidewalls 20B formed on both sides of the gate electrode 14b, n-type extension regions 16b formed in regions of the semiconductor substrate 11 located to both sides of the gate electrode 14b, p-type pocket regions 17b formed in regions of the semiconductor substrate 11 located under the n-type extension regions 16b, n-type source/drain regions 21b formed in regions of the semiconductor substrate 11 located further from the gate electrode 14b than the sidewall 20B, and silicide films 23 formed on the top surfaces of the gate electrode 14b and source/drain regions 21b, respectively. The sidewalls 20B include offset spacers 15b formed on both sides of the gate electrode 14b, first sidewalls (L-shaped sidewalls) 18b formed on the lateral sides of the offset spacers 15b to take the form of L, and plate-like second sidewalls 19b formed on the first sidewalls 18b.

Although not shown in FIG. 1, a plurality of contact plugs are formed in the interlayer dielectric 24 so as to be electrically connected to the gate electrode 14a and source/drain regions 21a of the first MIS transistor 51, one of the silicide layers 23 formed on the gate electrode 14b of the second MIS transistor 52 and the other ones of the silicide layers 23 formed on the source/drain regions 21b thereof.

The plasma reaction films 22 are formed of a high-density silicon oxide film (plasma oxide film) formed by oxidizing silicon in an oxygen plasma atmosphere and each have a thickness of approximately 2 nm. Since the plasma reaction films 22 are formed of a high-density silicon oxide film, they each have a high etch resistance to fluoric acid and APM. The plasma reaction films 22 each have a higher density than a silicon oxide film formed by CVD (hereinafter, referred to as "CVD oxide film") and a low etch rate in wet etching. Therefore, even when the plasma reaction films 22 each have a small thickness of 2 nm, they will not become lost in wet cleaning carried out in a semiconductor device fabrication process.

Meanwhile, when other plasma reaction films 22 are once formed also on the gate electrode 14b and source/drain regions 21b of the second MIS transistor 52 and then the once formed plasma reaction films 22 are removed from the salicide transistor formation region SB to allow the second MIS transistor 52 to have a salicide structure, the above-mentioned small thickness of the plasma reaction films 22 prevents the once formed plasma reaction films 22 from being partially left at the foot of the sidewalls 20B of the second MIS transistor 52. Alternatively, plasma reaction films 22 can be selectively formed only on the non-salicide transistor formation region SA without being formed on the salicide transistor formation region SB as described below. Consequently, each of the silicide layers 23 formed on the source/drain regions 21b of the second MIS transistor 52 of a salicide structure is prevented from being reduced in its width along the gate length direction (its area). This prevents the area in which the silicide layer 23 serving as an underlayer of a contact plug is formed from being reduced. This provides a semiconductor device including salicide layers 23 for a second MIS transistor 52 of a salicide structure and thus allowing the resistance of source/drain regions 21b and the contact resistance to be small.

A fabrication method for a semiconductor device according to the first embodiment will be described below. FIGS. 2A through 2D illustrate the fabrication method for a semiconductor device of this embodiment step by step.

Figure 2A:
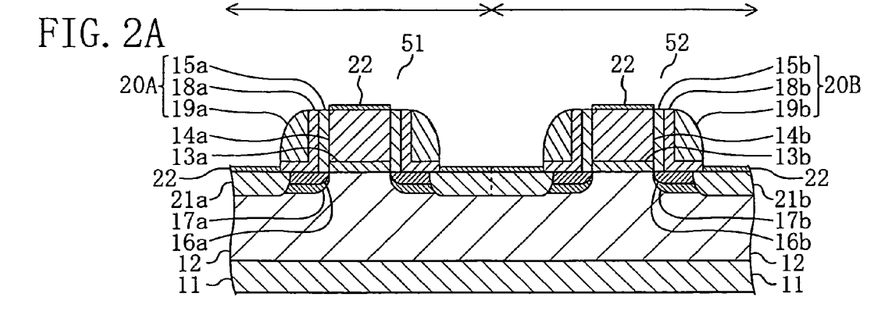
FIGS. 2A through 2D are cross-sectional views illustrating process steps in a fabrication method for a semiconductor device according to the first embodiment of the present invention step by step.

First, as illustrated in FIG. 2A, a p-type well 12 is formed in a semiconductor substrate 11 of silicon. Thereafter, a gate insulating film 13a and a gate electrode 14a of polysilicon are formed on a non-salicide transistor formation region SA of the semiconductor substrate 11 (well 12), and a gate insulating film 13b and a gate electrode 14b of polysilicon are formed on a salicide transistor formation region SB of the semiconductor substrate 11. Offset spacers 15a and 15b made of a silicon oxide film (thermal oxide film) using thermal oxidation are formed on both sides of the gate electrodes 14a and 14b, respectively. Thereafter, arsenic (As) ions serving as an n-type impurity are implanted into the semiconductor substrate 11 using a combination of the gate electrode 14a and the offset spacers 15a and a combination of the gate electrode 14b and the offset spacer 15b as masks, thereby forming n-type extension regions 16a and n-type extension regions 16b. Subsequently, boron (B) ions serving as a p-type impurity are implanted into the semiconductor substrate 11 using a combination of the gate electrode 14a and the offset spacers 15a and a combination of the gate electrode 14b and the offset spacers 15b as masks, thereby forming p-type pocket regions 17a and p-type pocket regions 17b.

Thereafter, a silicon oxide film and a silicon nitride film are sequentially formed on the entire surface of the semiconductor substrate 11, and the silicon nitride film and the silicon oxide film are sequentially etched by anisotropic dry etching. In this way, first sidewalls 18a and 18b of a CVD oxide film are formed to cover the respective lateral sides of the offset spacers 15a and 15b and part of the top surface of the semiconductor substrate 11 and take the form of L, and plate-like second sidewalls 19a and 19b of a silicon nitride film are formed on the first sidewalls 18a and 18b. Thus, sidewalls 20A are formed of the offset spacers 15a, the first sidewalls 18a and the second sidewalls 19a, and sidewalls 20B are formed of the offset spacers 15b, the first sidewalls 18b and the second sidewalls 19b.

Thereafter, arsenic (As) ions and phosphorus ions both serving as n-type impurities are sequentially implanted into the semiconductor substrate 11 using a combination of the gate electrode 14a and the sidewalls 20A and a combination of the gate electrode 14b and the sidewalls 20B as masks, thereby forming source/drain regions 21a and 21b. A source/drain region between the gate electrode 14a and the gate electrode 14b is continuously formed and shared by the non-salicide transistor formation region SA and the salicide transistor formation region SB. However, for simplicity of subsequent description, a part of the source/drain region located to the left of the dotted line illustrated in FIGS. 2A through 2D is referred to as a source/drain region 21a for the non-salicide transistor formation region SA, and a part of the source/drain region located to the right of the dotted line illustrated in FIGS. 2A through 2D is referred to as a source/drain region 21b for the salicide transistor formation region SB.

Then, the semiconductor substrate 11 is exposed to oxygen plasma at a room temperature in an inductively-coupled-plasma processing chamber, thereby oxidizing exposed parts of the top surface of silicon. In this way, the resultant silicon oxide films (plasma oxide films) form plasma reaction films 22.

To be specific, the plasma reaction films 22 are selectively formed on the top surfaces of the gate electrodes 14a and 14b and the top surfaces of the source/drain regions 21a and 21b. The density of each plasma reaction film 22 is equal to or higher than that of each of the offset spacers 15a and 15b formed of a thermal oxide film and much higher than that of each of the first sidewalls 18a and 18b formed of a CVD oxide film.

Furthermore, the etch rate of the plasma reaction film 22 in wet etching is equal to or lower than that of each of the offset spacers 15a and 15b formed of a thermal oxide film and much lower than that of each of the first sidewalls 18a and 18b formed of a CVD oxide film. In view of the above, in this embodiment, the plasma reaction films 22 each have a thickness of 2 nm. However, when the plasma reaction films 22 each have a thickness of at least 1 nm, this can prevent a first MIS transistor 51 from being silicided. In order to facilitate film formation, the plasma reaction films 22 preferably each have a thickness of 6 nm or less.

Figure 2B:
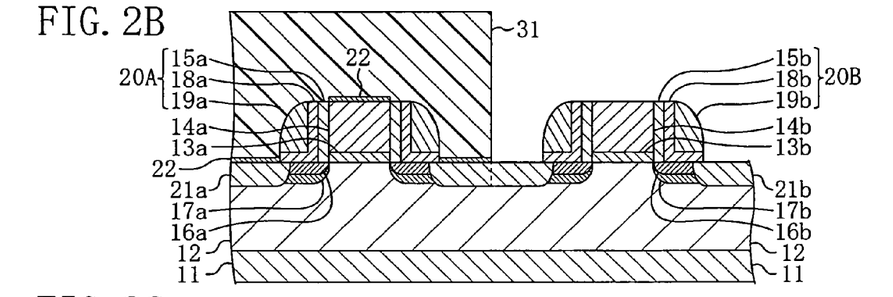

Next, as illustrated in FIG. 2B, a resist 31 is formed on the semiconductor substrate 11 to cover the non-salicide transistor formation region SA and expose the salicide transistor formation region SB. More particularly, the resist 31 covers ones of the plasma reaction films 22 located on the non-salicide transistor formation region SA and exposes the other ones of the plasma reaction films 22 located on the salicide transistor formation region SB. Then, ones of the plasma reaction films 22 formed on the gate electrode 14b and the source/drain regions 21b for the salicide transistor formation region SB are removed by dry etching using the resist 31 as an etching mask. In this way, the top surfaces of the gate electrode 14b and source/drain regions 16b for the salicide transistor formation region SB are exposed. Under these circumstances, since the plasma reaction films 22 are thin, this prevents the top surfaces of the gate electrode 14b and source/drain regions 21b from being etched away even with sufficient overetching and allows ones of the plasma reaction films 22 located on the salicide transistor formation region SB to be etched away without being partially left at the foot of the sidewalls 20B.

Figure 2C:
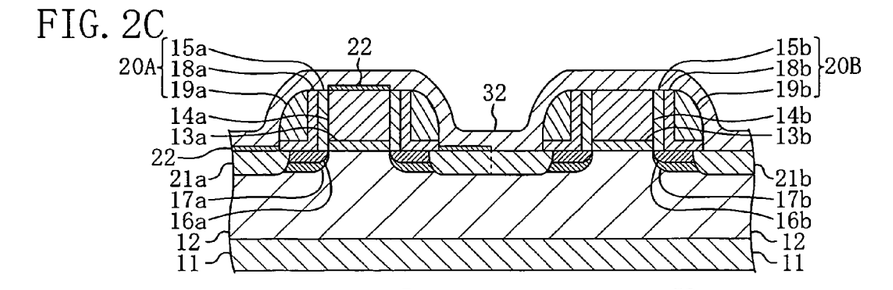

Next, as illustrated in FIG. 2C, the resist 31 is removed by ashing and cleaning, and then a refractory metal film 32 is deposited to cover the semiconductor substrate 11. Nickel (Ni), cobalt (Co), titanium (Ti), or any other material may be used as the refractory metal film 32.

Subsequently, the first heat treatment is performed so that the refractory metal film 32 reacts with silicon forming part of the gate electrode 14b and part of the source/drain regions 21b, thereby forming silicide layers 23 at the top surfaces of the gate electrode 14b and source/drain regions 21b.

Figure 2D:
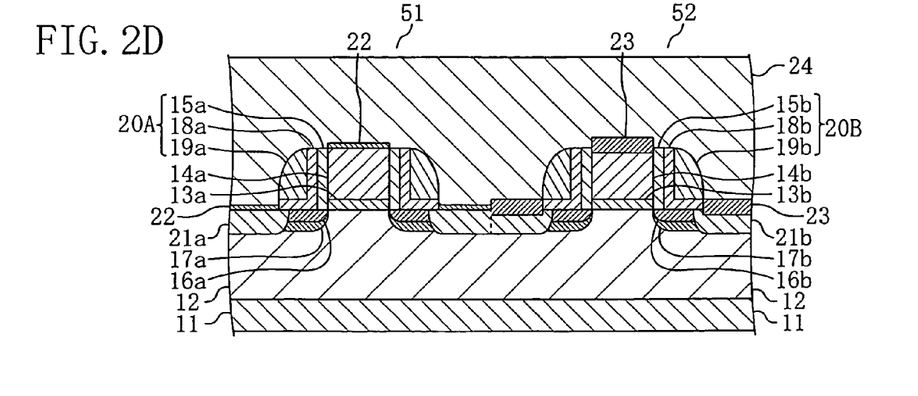

Next, as illustrated in FIG. 2D, unreacted part of the refractory metal film 32 is removed by wet etching, and then the second heat treatment is performed at a higher temperature than that in the first heat treatment to reduce the resistance of the silicide layers 23. In this way, a first MIS transistor 51 of a non-salicide structure in which no silicide layer is formed on the top surfaces of the gate electrode 14a and source/drain regions 21a is formed on the non-salicide transistor formation region SA. On the other hand, a second MIS transistor 52 of a salicide structure in which silicide layers 23 are formed on the top surfaces of the gate electrode 14b and source/drain regions 21b is formed on the salicide transistor formation region SB. Thereafter, an interlayer dielectric 24 is formed to cover the first and second MIS transistors 51 and 52. Then, contact plugs (not shown) are formed in the interlayer dielectric 24 to reach the gate electrode 14a, the source/drain regions 21a, one of the silicide layers 23 located on the gate electrode 14b, and the other ones of the silicide layers 23 located on the source/drain regions 21b. Thereafter, an interconnect (not shown) is formed on the interlayer dielectric 24 so as to be connected to the contact plugs.

According to the fabrication method for a semiconductor device of this embodiment, since thin plasma reaction films 22 are used as protective films for salicidation, this prevents ones of the plasma reaction films 22 located on a salicide transistor formation region SB from being partially left at the foot of the sidewalls 20B of a second MIS transistor 52 after removal of the plasma reaction films 22 by dry etching. This permits formation of silicide layers 23 on the entire surfaces of source/drain regions 21b exposed to the lateral sides of the sidewalls 20B of the second MIS transistor 52. This prevents the area in which contact plugs are formed from being reduced and prevents the contact resistance from increasing. At the same time, the following problem can be prevented from being caused: since the distance between adjacent ones of gate electrodes is reduced due to part of the protective film left at the foot of sidewalls, this makes it impossible to uniformly deposit an interlayer dielectric. Since the plasma reaction films 22 have a high density and thus a high wet etch resistance, this can certainly prevent a first MIS transistor 51 from being salicided.

Embodiment 2

A second embodiment of the present invention will be described with reference to the drawings. A semiconductor device of this embodiment has the same structure as that of the first embodiment, and thus its structure will not be described. FIGS. 3A through 3D illustrate process steps in a fabrication method for a semiconductor device according to the second embodiment of the present invention step by step. In the same process steps as those of the first embodiment, gate electrodes 14a and 14b and sidewalls 20A and 20B are formed on a semiconductor substrate 11, and extension regions 16a and 16b, pocket regions 17a and 17b, and source/drain regions 21a and 21b are formed therein. Therefore, the same process steps will not be described.

Figure 3A:
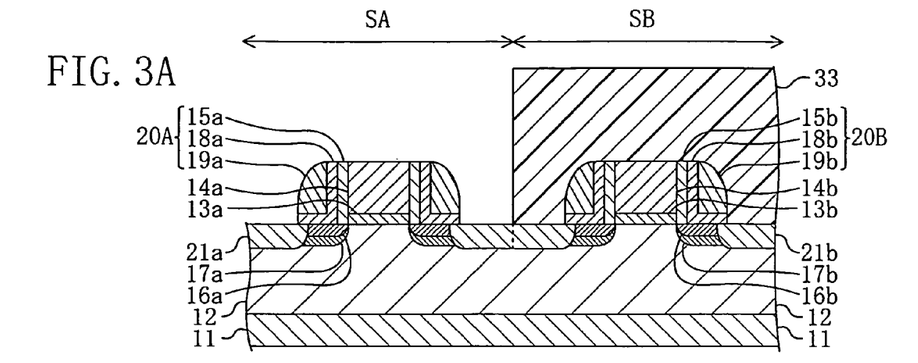
FIGS. 3A through 3D are cross-sectional views illustrating process steps in a fabrication method for a semiconductor device according to a second embodiment of the present invention step by step.

First, as illustrated in FIG. 3A, a resist 33 is formed on the semiconductor substrate 11 to cover a salicide transistor formation region SB and expose a non-salicide transistor formation region SA. More particularly, the resist 33 covers the top surfaces of the gate electrode 14b and source/drain regions 21b for the salicide transistor formation region SB and exposes the top surfaces of the gate electrode 14a and source/drain regions 21a for the non-salicide transistor formation region SA.

Figure 3B:
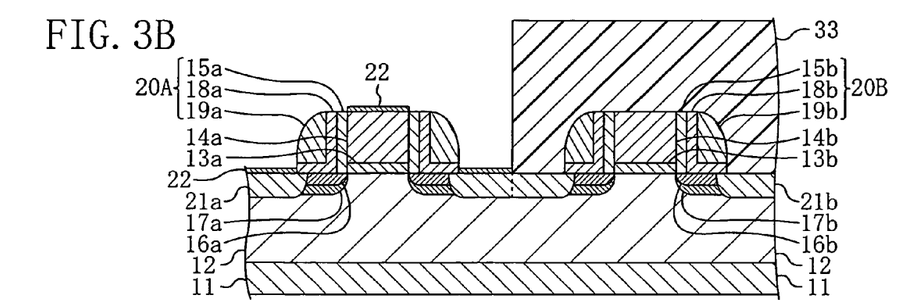

Next, as illustrated in FIG. 3B, the semiconductor substrate 11 on which the resist 33 is formed is exposed to oxygen plasma at a room temperature in an inductively-coupled-plasma processing chamber, thereby oxidizing the top surfaces of the gate electrode 14a and source/drain regions 21a of silicon whose surface is exposed. In this way, the resultant silicon oxide films (plasma oxide films) form 2 nm thick plasma reaction films 22. Since the above-mentioned oxygen plasma process is carried out at a room temperature, the resist 33 can be used as a film for preventing plasma oxidation. In view of the above, plasma reaction films 22 are selectively formed on the top surfaces of the gate electrode 14a and source/drain regions 21a without being formed on the top surfaces of the gate electrode 14b and source/drain regions 21b covered with the resist 33.

Figure 3C:
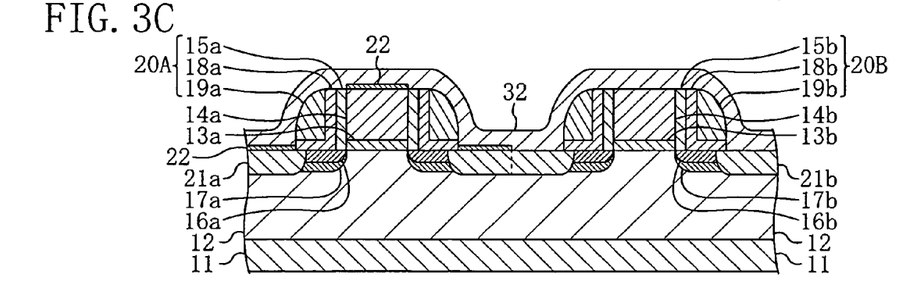

Next, as illustrated in FIG. 3C, the resist 33 is removed by ashing and cleaning, and then a refractory metal film 32 is deposited to cover the semiconductor substrate 11. Ni, Co, Ti, or any other material may be used as the refractory metal film 32.

Subsequently, the first heat treatment is performed so that the refractory metal film 32 reacts with silicon forming part of the gate electrode 14b and part of the source/drain regions 21b, thereby forming silicide layers 23 at the top surfaces of the gate electrode 14b and source/drain regions 21b.

Figure 3D:
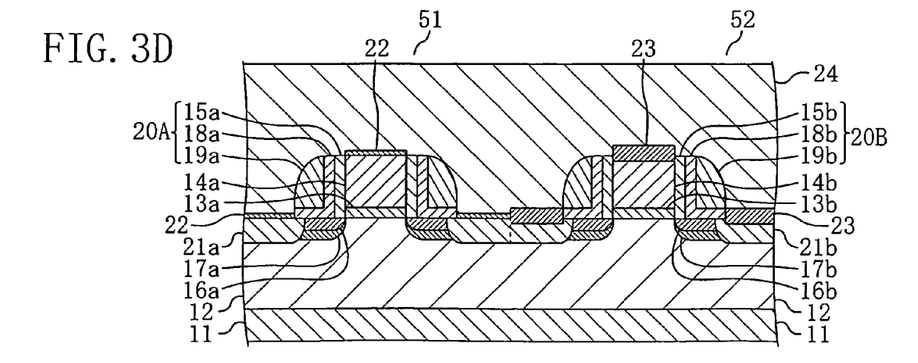

Next, as illustrated in FIG. 3D, unreacted part of the refractory metal film 32 is removed by wet etching, and then the second heat treatment is performed at a higher temperature than that in the first heat treatment to reduce the resistance of the silicide layers 23. In this way, a first MIS transistor 51 of a non-salicide structure in which no silicide layer is formed on the top surfaces of the gate electrode 14a and source/drain regions 21a is formed on the non-salicide transistor formation region SA. On the other hand, a second MIS transistor 52 of a salicide structure in which silicide layers 23 are formed on the top surfaces of the gate electrode 14b and source/drain regions 21b is formed on the salicide transistor formation region SB. Thereafter, an interlayer dielectric 24 is formed to cover the first and second MIS transistors 51 and 52. Then, contact plugs (not shown) are formed in the interlayer dielectric 24 to reach the gate electrode 14a, the source/drain regions 21a, one of the silicide layers 23 located on the gate electrode 14b, and the other ones of the silicide layers 23 located on the source/drain regions 21b. Thereafter, an interconnect (not shown) is formed on the interlayer dielectric 24 so as to be connected to the contact plugs.

According to the fabrication method for a semiconductor device of this embodiment, since plasma reaction films 22 are selectively formed only on a non-salicide transistor formation region SA, dry etching does not have to be used to remove ones of plasma reaction films 22 located on a salicide transistor formation region SB. This prevents the salicide transistor formation region SB on which a second MIS transistor 52 of a salicide structure is formed from being damaged due to dry etching. Furthermore, since the plasma reaction films 22 are formed by plasma oxidation at a room temperature, a resist 33 can be used as a film for preventing plasma oxidation. This prevents process steps in the fabrication method for a semiconductor device from being complicated.

Although in each embodiment an n-type MISFET is formed, a p-type MISFET can also be formed in the same manner. Although plasma reaction films 22 are formed of a silicon oxide film, they may be formed of a silicon nitride film by using nitrogen plasma instead of oxygen plasma. Although in each embodiment a first MIS transistor 51 and a second MIS transistor 52 are adjacent to each other, active regions of a substrate may be isolated from one another so as to be surrounded by an isolation region thereof.

In an inductively-coupled-plasma processing chamber, plasma ion energy may be controlled not only by applying source power to a coil that produces normal plasma but also by applying bias power to the back surface of a substrate.

As described above, the semiconductor device of the present invention and the fabrication method for the same provide a semiconductor device in which a salicide transistor and a non-salicide transistor are formed on a single substrate and which prevents the contact resistance of the salicide transistor from increasing because of a protective film for salicidation and a fabrication method for the same and are useful as a semiconductor device in which a salicide transistor and a non-salicide transistor are formed on the same substrate and a fabrication method for the same.

What is claimed is:

1. A semiconductor device comprising:
   a substrate of silicon;
   a first MIS transistor including a first gate electrode of silicon formed on the substrate, first sidewall spacers formed on both sides of the first gate electrode, first source/drain regions formed in regions of the substrate located further from the first gate electrode than the first sidewall spacers, and plasma reaction films formed in direct contact with the respective top surfaces of the first gate electrode and first source/drain regions; and
   a second MIS transistor including a second gate electrode of silicon formed on the substrate, second sidewall spacers formed on both sides of the second gate electrode, second source/drain regions formed in regions of the substrate located further from the second gate electrode than the second sidewall spacers, and silicide layers covering the respective top surfaces of the second gate electrode and second source/drain regions, wherein
   each said plasma reaction film has a thickness of 1 nm through 2 nm both inclusive.

2. The semiconductor device of claim 1, wherein the plasma reaction films cover parts of the first MIS transistor except for at least the first sidewall spacers.

3. The semiconductor device of claim 1, wherein each said first sidewall spacer includes an offset spacer having an I-shaped cross section and made of a thermal oxide film.

4. The semiconductor device of claim 3, wherein
the plasma reaction films are formed of a plasma oxide film, and
the plasma oxide film is made of silicon oxide having a density equal to or higher than the thermal oxide film.

5. The semiconductor device of claim 3, wherein
the plasma reaction films are formed of a plasma oxide film, and
the wet etch rate of the plasma oxide film is equal to or lower than that of the thermal oxide film.

6. The semiconductor device of claim 1, wherein the plasma reaction films are formed of a plasma oxide film.

7. The semiconductor device of claim 1, wherein each said first sidewall spacer includes an L-shaped sidewall spacer having an L-shaped cross section and formed of a CVD oxide film.

8. The semiconductor device of claim 7, wherein
the plasma reaction films are formed of a plasma oxide film, and
the plasma oxide film is made of silicon oxide having a higher density than the CVD oxide film.

9. The semiconductor device of claim 7, wherein
the plasma reaction films are formed of a plasma oxide film, and
the wet etch rate of the plasma oxide film is lower than that of the CVD oxide film.

10. The semiconductor device of claim 1, wherein the plasma reaction films are formed of a plasma nitride film.

11. The semiconductor device of claim 1, wherein the plasma reaction films are formed using inductively-coupled plasma.

12. The semiconductor device of claim 1, wherein
the silicide layers are not formed on the respective top surfaces of the first gate electrode and first source/drain regions, and
the plasma reaction films are not formed on the respective top surfaces of the second gate electrode and second source/drain regions.

* * * * *